United States Patent
Yi et al.

(10) Patent No.: US 8,021,747 B2
(45) Date of Patent: Sep. 20, 2011

(54) TRANSPARENT CARBON NANOTUBE ELECTRODE WITH NET-LIKE CARBON NANOTUBE FILM AND PREPARATION METHOD THEREOF

(75) Inventors: Dong Kee Yi, Yongin-si (KR); Seon Mi Yoon, Yongin-si (KR); Jae Young Choi, Yongin-si (KR); O Ok Park, Seoul (KR); Mun Ho Kim, Daejeon (KR); Hong Kyoon Choi, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 685 days.

(21) Appl. No.: 11/767,273

(22) Filed: Jun. 22, 2007

(65) Prior Publication Data

US 2008/0171193 A1    Jul. 17, 2008

(30) Foreign Application Priority Data

Jan. 17, 2007   (KR) .................. 10-2007-0005201

(51) Int. Cl.
*B32B 5/18* (2006.01)
*B32B 17/06* (2006.01)
*B32B 27/06* (2006.01)
*B32B 27/12* (2006.01)
*B32B 27/16* (2006.01)

(52) U.S. Cl. ............ 428/304.4; 428/311.11; 428/311.51; 428/315.5; 428/408; 428/412; 428/426; 428/480; 428/473.5; 428/500; 428/522; 313/326; 427/122; 252/502; 911/902; 911/932; 911/734; 911/742; 911/750

(58) Field of Classification Search .................. None
See application file for complete search history.

(56) References Cited

U.S. PATENT DOCUMENTS

| 6,066,442 A * | 5/2000 | Kurachi et al. ............... 430/530 |
| 6,842,328 B2 * | 1/2005 | Schott et al. .................. 361/302 |
| 6,921,575 B2 * | 7/2005 | Horiuchi et al. .............. 428/367 |
| 6,988,925 B2 * | 1/2006 | Arthur et al. .................... 445/46 |
| 7,070,753 B2 * | 7/2006 | Niu et al. .................. 423/447.1 |

(Continued)

FOREIGN PATENT DOCUMENTS

JP    2006-171336    *    6/2006

(Continued)

OTHER PUBLICATIONS

Ago, et al., "Composites of Carbon Nanotubes and Conjugated Polymers for Photovoltaic Devices," Adv. Mater., 11 (15): 1281-1285 (1999).

(Continued)

*Primary Examiner* — Vivian Chen
(74) *Attorney, Agent, or Firm* — Cantor Colburn LLP

(57) ABSTRACT

Provided is a transparent carbon nanotube (CNT) electrode comprising a net-like (i.e., net-shaped) CNT thin film and a method for preparing the same. More specifically, a transparent CNT electrode comprises a transparent substrate and a net-shaped CNT thin film formed on the transparent substrate, and a method for preparing a transparent CNT electrode, comprising forming a thin film using particulate materials and CNTs, and then removing the particulate materials to form a net-shaped CNT thin film. The transparent CNT electrode exhibits excellent electrical conductivity while maintaining high light transmittance. Therefore, the transparent CNT electrode can be widely used to fabricate a variety of electronic devices, including image sensors, solar cells, liquid crystal displays, organic electroluminescence (EL) displays, and touch screen panels, that have need of electrodes possessing both light transmission properties and conductive properties.

10 Claims, 5 Drawing Sheets

U.S. PATENT DOCUMENTS

| | | | |
|---|---|---|---|
| 7,226,818 B2 | 6/2007 | Malenfant et al. | |
| 7,247,670 B2 | 7/2007 | Malenfant et al. | |
| 7,261,852 B2* | 8/2007 | Rinzler et al. | 264/317 |
| 7,378,040 B2* | 5/2008 | Luo et al. | 252/500 |
| 7,411,085 B2* | 8/2008 | Hirakata et al. | 560/116 |
| 7,456,310 B2* | 11/2008 | Kim et al. | 560/141 |
| 7,563,711 B1* | 7/2009 | Ward et al. | 438/669 |
| 7,593,004 B2* | 9/2009 | Spath et al. | 345/174 |
| 7,645,497 B2* | 1/2010 | Spath et al. | 428/1.4 |
| 2004/0007528 A1* | 1/2004 | Bakajin et al. | 210/650 |
| 2006/0081882 A1 | 4/2006 | Malenfant et al. | |
| 2006/0244741 A1 | 11/2006 | Kimura et al. | |
| 2006/0249203 A1 | 11/2006 | Li et al. | |
| 2006/0261733 A1 | 11/2006 | Suzuki et al. | |
| 2008/0088219 A1* | 4/2008 | Yoon et al. | 313/326 |
| 2009/0252967 A1* | 10/2009 | Yoon et al. | 428/408 |

FOREIGN PATENT DOCUMENTS

| | | | |
|---|---|---|---|
| JP | 2006171336 | | 6/2006 |
| TW | 94103247 | | 11/2006 |
| WO | WO 2004/052559 | * | 6/2004 |
| WO | 2007058488 A1 | | 5/2007 |

OTHER PUBLICATIONS

Artukovic, et al., "Transparent and Flexible Carbon Nanotube Transistors," Nano Letters, 5(4): 757-760 (2005).

Caneba, et al., "Electrical and Thermal Coatings from a Single-Walled Carbon Nanotube (SWCNT)/Polyer Composite," Journal of Minerals & Materials Characterization & Engineering, 3(2): 91-111 (2004).

Chen, et al., "Dry friction and wear characteristics of nickel/carbon nanotube electroless composite deposits," Tribology International, 39: 22-28 (2006).

European Search Report for application No. 07116655.7-2208/1914781, dated Oct. 27, 2009.

Grigorian, et al., "Reversible Intercalation of the Charged Iodine Chains into Carbon Nanotube Ropes," Physical Review Letters, 80(25): 5560-5563 (1998).

Hu, et al., "Percolation in Transparent and Conducting Carbon Nanotube Networks," Nano Letters, 4(12): 2513-2517 (2004).

Kim, et al., "Rapid Fabrication of Two- and Three-Dimensional Colloidal Crystal Films via Confined Convective Assembly," Adv. Funct. Mater., 15: 1329-1335 (2005).

Kim, et al., "Synthesis, characteristics, and field emission of doped and de-doped polypyrrole, polyaniline, poly(3,4-ethylenedioxythiophene nanotubes and nanowires," Synthetic Metals, 150: 279-284 (2005).

Moulton, et al., "Biomolecules as selective dispersants for carbon nanotubes," Carbon, 43: 1879-1884 (2005).

* cited by examiner

TRANSPARENT CARBON NANOTUBE ELECTRODE WITH NET-LIKE CARBON NANOTUBE FILM AND PREPARATION METHOD THEREOF

This non-provisional application claims priority to Korean Patent Application No. 10-2007-0005201 filed on Jan. 17, 2007, and all the benefits accruing therefrom under 35 U.S.C. §119(a), which is herein incorporated by reference in its entirety.

BACKGROUND OF THE INVENTION

1. Field of the Invention

The present invention relates to a transparent carbon nanotube ("CNT") electrode comprising a net-like CNT thin film and a method for preparing the same. More specifically, the present invention relates to a transparent CNT electrode having excellent conductive properties and light transmission properties, comprising a transparent substrate and a net-like CNT thin film formed on the transparent substrate, and a method for preparing the same.

2. Description of the Related Art

Transparent electrodes consisting of a transparent substrate and a conductive film formed on the transparent substrate are now widely used to fabricate a variety of electronic devices, including image sensors, solar cells, liquid crystal displays, organic electroluminescence ("EL") displays, and touch screen panels, that are required to have both light transmission properties and conductive properties.

Indium tin oxide ("ITO") electrodes have been predominantly used as electrodes for transparent substrates because ITO readily forms a thin film on glass substrates and exhibits excellent light transmission properties and conductive properties. Vacuum deposition equipment is generally used to produce ITO electrodes. In particular, sputtering equipment is used in view of the excellent characteristics of transparent ITO films prepared by this method. Use of sputtering techniques, however, requires that transparent electrodes be produced at a high processing temperature, typically 200° C. or higher, sometimes 400° C. or higher. Therefore, sputtering techniques are not suitable for the production of flexible displays using transparent electrodes. Moreover, the ITO electrodes are rigid (i.e., inflexible), and when used to prepare flexible displays causes undesirably increased sheet resistance and poor durability of the flexible displays.

To solve these problems, research is actively underway on preparation of transparent carbon nanotube (CNT) electrodes, which use CNTs having high electrical conductivity as materials to form electrode films on transparent substrates. For example, a CNT transparent electrode can be formed from a dispersion of CNTs spray coated on a substrate. However, electrode films prepared using such a method suffers in that significant loss of CNTs results, and there are limitations on electrode films prepared using such methods that are associated with difficulty in controlling film thickness at nanometer scale. As such, formation of the transparent electrode using a dispersion of CNTs in suitable media is required to maintain optical transmissivity of the resulting thin film transparent electrode. Various attempts to prepare the transparent electrode have been made by dispersing the CNTs using dispersants. However, most of the dispersants are composed of organic materials which when incorporated into the transparent electrode can act as insulators, thereby presenting problems associated with poor conductivity of the transparent electrode upon formation of CNTs into a CNT thin film.

BRIEF SUMMARY OF THE INVENTION

Therefore, in view of the problems of the prior art, a transparent carbon nanotube (CNT) electrode having excellent conductive properties and light transmission properties is provided by inclusion of a CNT thin film in the form of a net-like (also referred to herein as a net-shaped) structure.

In another embodiment, an electronic device comprises the transparent CNT electrode.

In another embodiment, a method for preparing a transparent CNT electrode comprises a net-shaped CNT thin film.

In accordance with another embodiment, there is provided a transparent carbon nanotube (CNT) electrode comprising a transparent substrate and a CNT thin film having a net-shaped (i.e., net-like) structure formed on the transparent substrate.

In accordance with another embodiment, there is provided a method for preparing a transparent carbon nanotube (CNT) electrode, comprising:

(a) mixing particulate materials and CNTs to form a mixed composition;

(b) forming a mixed-composition thin film on a transparent substrate; and (c) removing the particulate materials from the mixed-composition thin film and leaving CNTs to form a net-shaped CNT thin film.

In accordance with yet another embodiment, there is provided a method for preparing a transparent carbon nanotube (CNT) electrode, comprising:

(a) arranging particulate materials on a transparent substrate to form a particulate thin film;

(b) injecting a CNT composition into the particulate thin film; and (c) removing the particulate materials from the CNT composition-injected thin film and leaving CNTs to form a net-shaped CNT thin film.

BRIEF DESCRIPTION OF THE DRAWINGS

The above and other features and advantages of the present invention will be more clearly understood from the following detailed description taken in conjunction with the accompanying drawings, wherein.

DETAILED DESCRIPTION OF THE INVENTION

Figure 1:
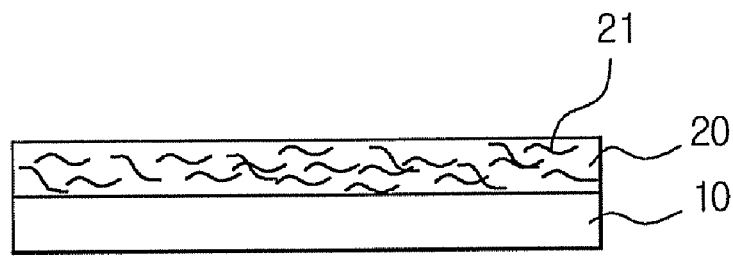
FIG. 1 is a schematic cross-sectional view of an exemplary transparent CNT electrode according to an embodiment.

The present invention will now be described in greater detail with reference to the accompanying drawings.

It will be understood that when an element is referred to as being "on" another element, it can be directly on the other element or intervening elements may be present therebetween. In contrast, when an element is referred to as being "disposed on" or "formed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements and the thicknesses of layers and regions are exaggerated for clarity.

As disclosed herein, a transparent CNT electrode comprises a transparent substrate and a net-shaped CNT thin film formed on the transparent substrate and which exhibits excellent conductive properties in conjunction with high light transmittance, as provided by the formation of a CNT thin film having the form of a net-shaped structure.

FIG. 1 is a schematic cross-sectional view of a transparent CNT electrode according to an embodiment. As shown in FIG. 1, the transparent CNT electrode comprises a transparent substrate 10 and a net-shaped CNT thin film 20, comprising CNTs 21 and voids (not shown) surrounded by the CNTs 21 formed on a surface of the transparent substrate 10.

The transparent substrate 10 used in the transparent CNT electrode can be of any type so long as it is transparent. Specific exemplary substrates include transparent inorganic substrates, such as glass and quartz substrates, and flexible transparent substrates, such as plastic substrates. Examples of suitable materials used to prepare flexible transparent substrates include, but are not limited to, polyethylene terephthalate, polyethylene naphthalate, polyethylene sulfone, polycarbonate, polystyrene, polypropylene, polyester, polyimide, polyetheretherketone, polyetherimide, acrylic resins, olefin-maleimide copolymers, and norbornene resins. These materials may be used alone or in any combination thereof.

In FIG. 1, the CNTs 21 used in a CNT composition constituting the CNT thin film 20 are not particularly limited so long as they do not significantly adversely affect the desired properties of the CNT thin film prepared therewith. Specifically, the CNTs may be selected from the group consisting of single-walled carbon nanotubes, double-walled carbon nanotubes, multi-walled carbon nanotubes, rope carbon nanotubes, and a combination thereof. When it is intended to use single-walled carbon nanotubes, metallic carbon nanotubes can be selectively separated from the carbon nanotubes by a chemical separation process before use of the CNTs.

The desired light transmittance of the net-shaped CNT thin film 20 can be appropriately determined by those skilled in the art according to the intended applications and needs. In order to use the CNT thin film as a transparent electrode however, in an embodiment, it is desirable to adjust, using for example thickness and/or composition, the visible light transmittance of the CNT thin film to 60% or more, specifically 75% or more, at a wavelength of 550 nm or 600 nm.

The net-shaped CNT thin film 20 of the transparent CNT electrode can further contain a dispersant (not shown). Dispersants used to disperse the CNTs 21 are not particularly restricted, so long as the use of such dispersants does not significantly adversely affect the desired properties of the CNT thin film. Conductive dispersants are specifically useful, however. Exemplary dispersants having conductive properties, that are useful to improve electrical conductivity of the transparent CNT electrode, include polythiophene, polyaniline and poly(2-ethylhexyloxy-5-methoxy-1,4-phenylvinylene). Further, the conductive dispersant can have a structure that includes a head containing an aromatic ring with a high affinity for the CNTs, and a tail with an affinity for the dispersion medium. Alternatively, the dispersant may be doped to increase the conductivity of the CNT electrode.

In an embodiment, the CNT thin film 20 can further contain nanoparticles (not shown), to be included in the formation of the net-shaped CNT thin film. There is no particular limit to nanoparticles that can be used. For example, useful nanoparticles can include polymer nanoparticles, inorganic nanoparticles, metallic nanoparticles, and the like. Specifically, in an embodiment, metal nanoparticles capable of improving conductivity are used. Such nanoparticles can be positioned between CNT chains, and improve electrical conductivity and light transmittance of the CNT thin film.

As such, the transparent CNT electrode exhibits superior electrical conductivity simultaneously with high light transmittance, and can therefore be applied to a variety of electronic devices, without limitation. In another embodiment, an electronic device comprises the transparent CNT electrode. Examples of the electronic devices comprising the transparent CNT electrode can include, but are not limited to, a variety of devices including image sensors, solar cells, liquid crystal displays, organic electroluminescence (EL) displays, and touch screen panels. The constitution and configuration of any of the various electronic devices that can comprise the transparent CNT electrode can be determined by one skilled in the art to which the invention pertains, and therefore details thereof will be omitted from this description for the sake of convenience.

A method for preparing a transparent CNT electrode is also disclosed. In an embodiment, the transparent CNT electrode can be prepared by a method comprising:

(a) mixing particulate materials and carbon nanotubes (CNTs) to form a mixed composition;

(b) forming a mixed-composition thin film on a transparent substrate using the mixed composition; and (c) removing the particulate materials from the mixed-composition thin film while leaving CNTs to form a net-shaped CNT thin film.

Figure 3:
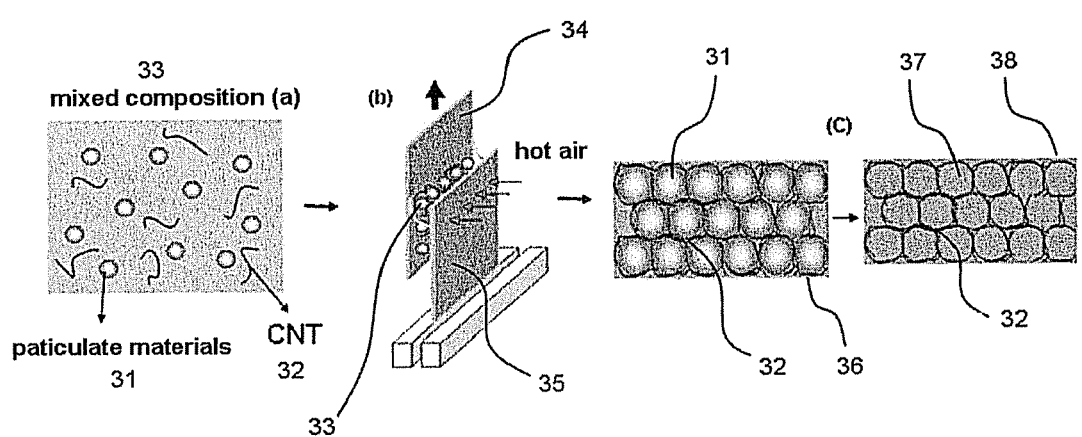
FIG. 3 is a schematic process view illustrating fabrication of an exemplary transparent CNT electrode according to an embodiment.

Herein, materials used in the method are as described above. FIG. 3 is a schematic process view illustrating fabrication of a transparent CNT electrode according to an embodiment. A more detailed explanation of the respective steps of the method will be given with reference to FIG. 3.

(a): Formation of Mixed Composition 33 Comprising Particulate Materials 31 and a CNT Composition Comprising CNTs 32

For preparation of a transparent CNT electrode 30, particulate materials 31 are first mixed with a CNT composition comprising CNTs 32 to provide a mixed composition 33.

There is no particular limit to a mixing ratio of the particulate material 30 and CNT 32 in the mixed composition 33. For example, the mixing ratio of the particulate material 31 to the CNTs 32 can be in the range of about 1:5 to 1:30 (w/w) respectively, provided the desired light transmittance and electrical conductivity properties of the transparent CNT electrode are maintained, or are not significantly adversely affected.

There is also no particular limit to the particulate materials 31 used, so long as they are colloidal materials. Either or both of organic and inorganic colloidal particles can be used. In an embodiment, specific exemplary organic colloidal particles that can be used in include, but are not limited to, polystyrene, polymethylmethacrylate, polylysine, polydivinylbenzene, or a combination thereof. Specific examples of the inorganic colloidal particles that can be used can include, but are not limited to, silica, titania, silver, gold, a combination thereof, or an alloy thereof.

Since CNTs 32 are also arranged between the particulate materials 31, the desired size of particulate material 31 is determined after taking into consideration the light transmittance and electrical conductivity of the transparent CNT electrode. For example, the particulate material 31 having a particle size of 50 nm to 10 μm may be used. Further, compactness of CNT distribution may be adjusted by using a combination of the particulate materials having a different particle size, thereby making it possible to control the light transmittance and surface resistance of transparent electrode.

The CNT composition used is a mixed composition of CNTs 32 and a solvent. The solvent used is not particularly limited so long as it is miscible with CNTs.

(b) Formation of Mixed-Composition Thin Film 36 by Application of Mixed Composition 33 to Transparent Substrate A mixed-composition thin film 36 is formed on a transparent substrate (not shown), using the mixed composition 33 obtained in (a). As a result, and as shown in FIG. 3, CNTs 32 are arranged between the particulate materials 31, upon formation of the mixed-composition thin film 36.

The method for formation of the mixed-composition thin film 36 on the transparent substrate is not particularly limited. For example, a conventional coating method or a convective arrangement method in which the particulate materials 31 and CNTs 32 are dispersed and arranged by thermal convection can be used.

Examples of a conventional coating technique may include spin coating, spray coating, filtration, and bar coating. A suitable coating technique can be selected depending on the characteristics of the solution and intended applications.

The convective arrangement of CNTs may be carried out by a variety of methods. For example, as shown in FIG. 3, an arrangement technique using a substrate can be used. Specifically, particulate materials 31 are arranged on the substrate by positioning a mixed composition 33 of particulate materials 31 and CNTs 32 between opposing surfaces of a first substrate 34 and a second substrate 35, facing opposite to each other at a fixed distance, and blowing hot air on the substrates and mixed composition to slowly evaporate the solvent while moving the first substrate 34 horizontally relative to the second substrate 35. As used herein and below, "moving the first substrate horizontally" means moving the first substrate in plane relative to the second substrate, such that the distance between the opposing surfaces of the first and second substrates remains substantially constant. For the convective arrangement method, details are disclosed and are as found in the following reference: Mun Ho Kim, Sang Hyuk Im, O Ok Park, *Advanced Functional Material*, 2005, vol. 15, pp. 1329-1335.

The surface of the substrate can be pretreated by a conventional process, such as, for example, $O_2$ plasma treatment, but not limited thereto.

In order to prevent aggregation between particulate materials 31, between the particulate materials 31 and CNTs 32, and between the CNTs 32, any of which may occur upon formation of the mixed-composition thin film 36, a dispersant (not shown) can be included. In an embodiment, the dispersant can be a conductive dispersant. In an embodiment, the dispersant and CNTs 32 are combined to disperse the CNTs 32. The resulting dispersion is then mixed with a colloidal (i.e., particulate material 31) solution, and the resulting mixture is applied to the substrate to form the mixed-composition thin film 36.

The conductive dispersant can further have a structure that includes a head containing an aromatic ring with a high affinity for the CNTs and a tail with an affinity for a dispersion medium. Where desired, when a conductive dispersant is used, the conductive dispersant can be doped to increase the conductivity of the CNT thin film 38.

In addition, the mixed composition 33 can further contain nanoparticles (not shown) that can be included during the formation of the mixed-composition thin film 36. The thus-added nanoparticles increase the particle-particle attractive force, which results in an improved degree of crystallinity for the particulate materials 31, thereby improving uniformity and arrangement properties of the particulate materials 31, and consequently contributing to improvements in light transmittance of the transparent CNT electrode prepared therefrom.

There is no particular limit to the nanoparticle materials that can be used. Since the added nanoparticles are easily capable of forming bridges between the particulate materials, use of metallic nanoparticles having high electrical conductivity can enhance the electrical conductivity of the transparent CNT thin film.

In order to improve conductivity of the transparent CNT electrode by increasing the density of CNTs 32 after formation of the CNT thin film 38, one or more additional mixed-composition thin films (not shown) can be formed on a surface of the first mixed-composition thin film 36 opposite any substrate using the CNT composition. The additional mixed-composition thin films are applied by repeating one or more of the foregoing steps as desired. As used herein, the CNT composition refers to the composition prepared by adding CNTs 32 to the solvent used for preparing a mixed composition 33 of particulate materials 31 and CNTs 32. There is no particular limit to the kinds of solvents that can be used in preparation of the mixed composition, and any solvent can be employed so long as it is miscible with CNTs while not causing dissolution of colloids (i.e., particulate materials 31). For example, water, ethanol, methanol, or the like can be used as the solvent.

Similar to formation of the mixed-composition thin film 36 using the CNT mixed composition 33, film formation using the CNT composition itself can also be carried out by a conventional coating method or a convective arrangement method as described above.

Step (c): Removal of Particulate Materials 31 from Mixed-Composition Thin Film 36

Particulate materials 31 are then removed from the mixed-composition thin film 36 in which the CNTs 32 are arranged between the particulate materials 31, and the CNTs 32 are allowed to form a net-shaped CNT thin film 38 having improved light transmittance.

The method used for removing the particulate materials from the mixed-composition thin film is not particularly limited. For example, the particulate materials 31 may be removed by solution treatment, such as by treatment with an organic solvent or an acid solution. Alternatively, removal of the particulate materials 31 can be effected by any method which is capable of eliminating (i.e., removing) the particulate materials 31, such as heat treatment, plasma treatment, or the like. Selection of an appropriate method of removing the particulate materials 31 will depend on the composition thereof.

Removal of particulate materials 31 using a solution can be carried out by soaking the mixed-composition thin film 36 in the solution of interest for a proper period of time, depending upon the kind of solvent to be used. The removal of particulate materials 31 by treatment with the organic solvent may use one or more organic solvents of toluene, cyclohexane, benzene, chloroform, and the like. The particulate materials 31 can also be removed by use of a base solution such as, for example, sodium hydroxide, or the like. Removal of particulate materials 31 by treatment with an acid solution can be done using one or more acids selected from the group consisting of hydrofluoric acid, acetic acid, and phosphoric acid.

Plasma treatment for removal of the particulate materials 31 can be done using oxygen ($O_2$) as a plasma source, and can be carried out at 200 to 800 watts of power for 1 to 5 min. For example, a plasma source operating at 500 watts for one minute can be sufficient for the plasma treatment.

The removal of particulate materials 31 by heat treatment can be carried out at a temperature of less than 550° C. where only the particulate materials 31 are removed, without accompanying decomposition of the CNTs 32, to ensure that the particulate materials 31 are removed selectively.

Figure 2:
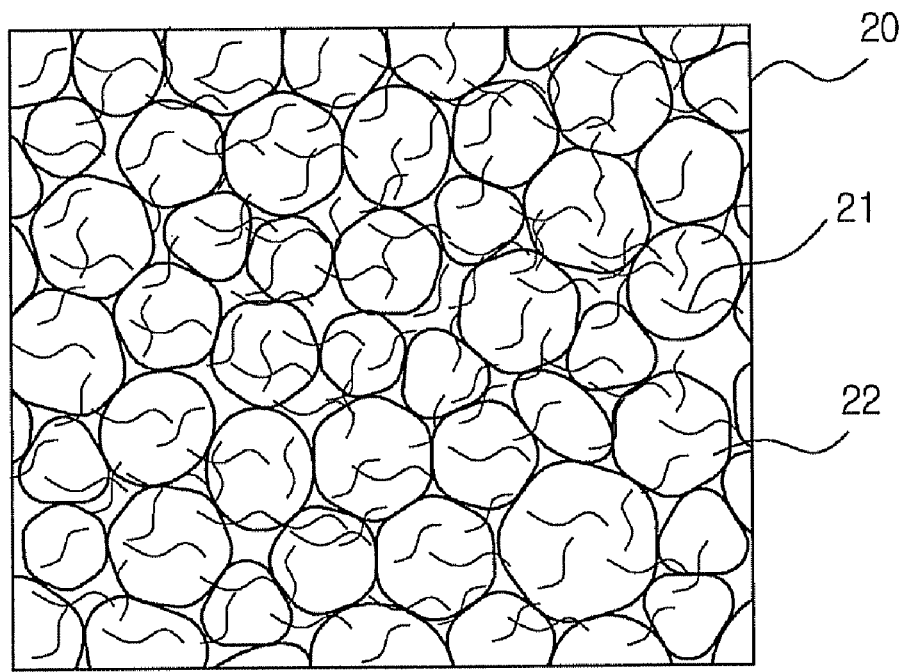
FIG. 2 is a schematic plan view of an exemplary transparent CNT electrode according to an embodiment.

Once the particulate materials 31, which act as a template around which the CNTs 32 are formed, are removed from the mixed-composition thin film 36, essentially only CNTs 32 remain as a network of interconnected CNTs surrounding spaces 37 previously occupied by the particulate materials 31, and thereby form a net-shaped CNT thin film 38. This is also illustrated in FIG. 2 in which the CNT thin film 20 essentially comprises CNTs 21 and spaces 22.

In another embodiment, a transparent CNT electrode can be prepared by a method comprising:
(a) arranging particulate materials on a transparent substrate to form a particulate thin film;
(b) injecting a CNT composition into the particulate thin film to form a CNT composition-injected thin film; and
(c) removing the particulate materials from the CNT composition-injected thin film and leaving CNTs to form a net-shaped CNT thin film.

Figure 4:
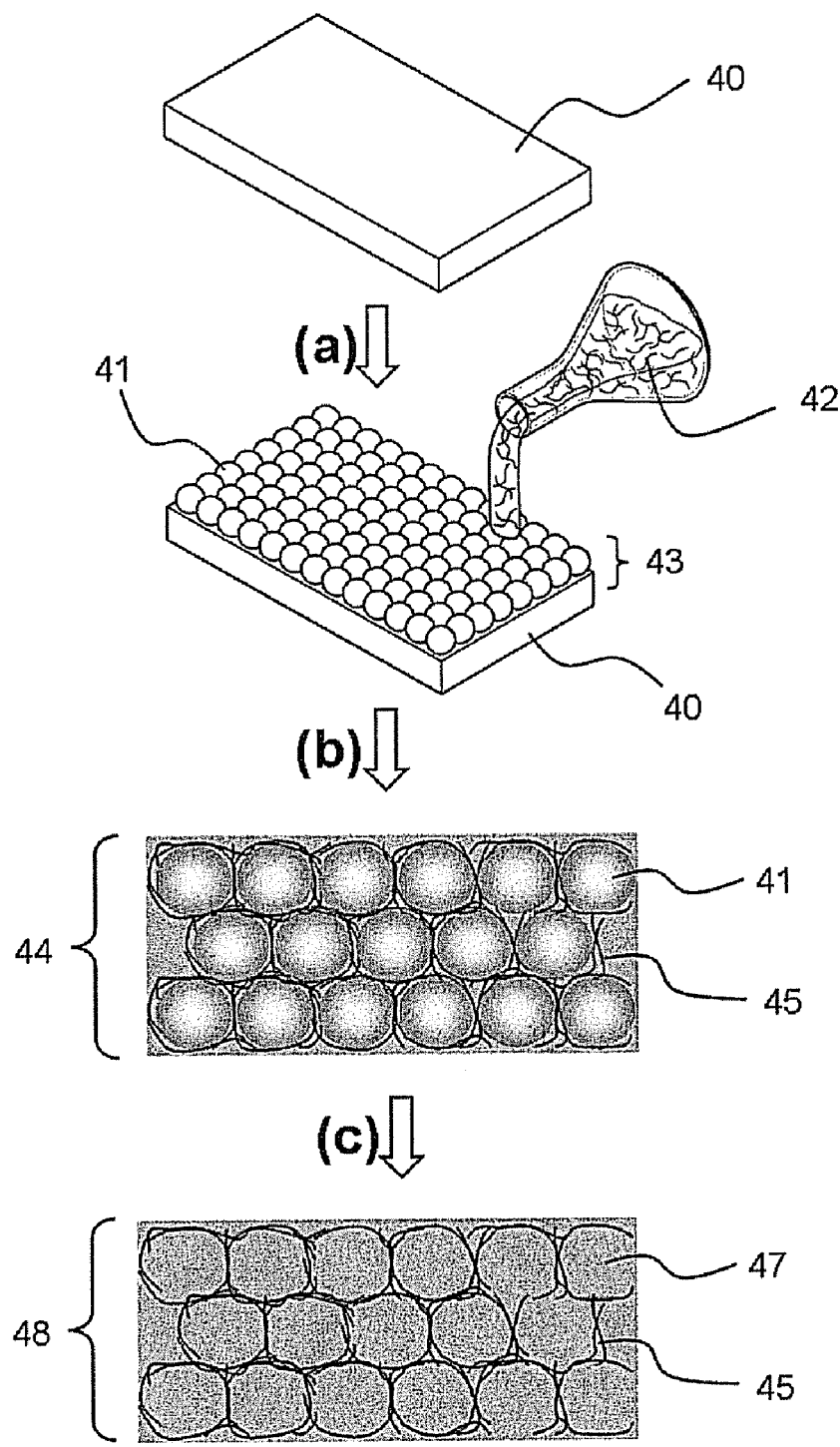
FIG. 4 is a schematic process view illustrating fabrication of an exemplary transparent CNT electrode according to another embodiment.

Materials used in the respective steps are as described hereinabove. FIG. 4 is a schematic process view illustrating fabrication of a transparent CNT electrode according to this embodiment. Further details of the respective steps of the method will be given with reference to FIG. 4.

Step (a): Formation of a Particulate Thin Film 43 by Arrangement of Particulate Materials 41 on Transparent Substrate 40

During fabrication of a transparent CNT electrode according to another embodiment, the particulate materials 41 are first arranged on a transparent substrate 40 to form a thin film of particulate material (i.e., the particulate thin film 43). The particulate thin film 43 can be formed by using a conventional coating method or a convective arrangement method. Examples of a conventional coating technique include spin coating, spray coating, filtration, and bar coating. A suitable coating technique can be selected depending on the characteristics of the solution and intended applications. There is no particular limit to the kind of solvent used, and any solvent can be employed so long as it is miscible with the particulate materials while not causing dissolution of colloids (i.e., particulate materials 41). For example, water, ethanol, methanol, or the like can be used as the solvent.

There is no particular limit to the parameters or requirements of the convective arrangement method. For example, as shown in FIG. 3, an arrangement technique using a substrate 40 can be performed. Specifically, particulate materials are arranged on the substrate 40 by positioning a mixed composition of particulate materials and CNTs between a first substrate and a second substrate (not shown), facing opposite to each other at a fixed distance, and blowing hot air on the first and second substrates and any mixed composition (not shown) to slowly evaporate any solvent while moving the first substrate horizontally relative to the second substrate.

The surface of the substrate 40 can be pretreated prior to use by a conventional process, such as for example $O_2$ plasma treatment, but not limited thereto.

In order to prevent aggregation between particulate materials 41 which may occur upon formation of the particulate thin film 43, a dispersant (not shown) may be included. The dispersant used can be a conductive dispersant. In an embodiment, the dispersant and CNTs 45 are first combined to disperse the CNTs 45. Then, the resulting dispersion is optionally mixed with a colloidal (i.e., particulate material) solution, and the resulting mixture is applied to the particulate thin film 43 on the substrate 40.

The conductive dispersant can further have a structure that includes a head containing an aromatic ring with a high affinity for the CNTs, and a tail with affinity for the dispersion medium. In an embodiment, the dispersant can be doped to increase the conductivity of the CNT thin film 48 prepared therefrom.

In addition, in an embodiment, nanoparticles (not shown) can be included during formation of the particulate thin film 43. The thus-added nanoparticles increase the attractive force between the particulate materials 41, which results in an improved degree of crystallinity of the particulate materials 41, thereby improving uniformity and arrangement properties of the particulate materials 41, and consequently contributing to improvements in light transmittance of the transparent CNT electrode.

There is no particular limit as to the kind of nanoparticle that can be used. Since the added nanoparticles are easily capable of forming bridges between the particulate materials, use of metallic nanoparticles having high electrical conductivity can enhance the electrical conductivity of the transparent CNT electrode.

In order to improve conductivity of the transparent CNT electrode by increasing the injection volume of CNTs 45 upon injection of the CNT composition 42 (in a subsequent step) after formation of the particulate thin film, the particulate materials 41 may be etched. There is no particular limit to the etching method that can be used. For example, etch methods that can be used include ion etching, plasma etching, and the like.

Step (b): Injection of CNT Composition 42 into the Particulate Thin Film 43

Next, a CNT composition 42 is injected into the particulate thin film 43 having the particulate materials 41 arranged as described hereinabove. As used herein, the CNT composition 42 refers to a composition prepared by adding CNTs 45 to a solvent which is miscible with CNTs 45. There is no particular limit to the kind of solvent used, where any solvent can be employed so long as it is miscible with CNTs 45 and is compatible with other components. For example, water, ethanol, methanol, or the like may be used, provided the solvent does not cause dissolution of colloid (i.e., particulate materials 41).

It is desirable to adjust the amount of the CNT composition 42 injected into the arranged particles (particulate materials 41) of the particulate thin film 43 to such that electrical conductivity of the transparent CNT electrode is increased relative to a similar CNT electrode prepared without use of the arranged particulate materials 41.

Any conventional injection method can be used without particular limitation. For example, as shown in FIG. 4, the CNT composition 42 may be poured onto the particulate thin film 43, followed by drying to remove solvent. In order to secure better uniformity, one end of the particulate thin film 43 can be soaked in a CNT solution 42 such that CNTs 45 impregnate the voids between the particles by capillary action. By this method, a CNT composition-injected thin film 44 is thus provided.

Step (c): Removal of Particulate Materials 41 from CNT Composition-Injected Thin Film 44

Finally, particulate materials 41 are removed from the CNT composition-injected thin film 44, and the remaining CNTs 45 remain to form a net-shaped CNT thin film 48. There is no particular limit as to the method used for removing the particulate materials 41, provided the method selected is suitable for removing particulate materials of the particular composition used. The particulate materials 41 may be removed by any conventional method, including for example solution treatment such as an organic solvent or acid solution treatment, base solution treatment, heat treatment, plasma treatment, or other method.

The removal of the particulate materials 41 using the solution can be carried out by soaking the CNT composition-injected thin film 44 in a solution of interest for a proper period of time, depending upon the kinds of solvent to be used. Removal of particulate materials 41 by treatment with the organic solvent can use one or more organic solvents selected from the group consisting of toluene, cyclohexane, benzene, chloroform, and a combination thereof. Particulate materials 41 can also be removed using base solution, such as for example a solution comprising sodium hydroxide, and the like. The removal of particulate materials 41 by treatment with the acid solution can use one or more acids selected from the group consisting of hydrofluoric acid, acetic acid, and phosphoric acid.

Removal of particulate materials 41 by heat treatment is desirably carried out at a temperature of less than 550° C. in which only the particulate materials 41 are removed without accompanying decomposition of any CNTs 45.

Once the particulate materials 41 are removed from the CNT composition-injected thin film 44, essentially only CNTs 45 remain to form a net-shaped CNT thin film 48, as shown in FIG. 4.

In order to improve conductivity of the transparent CNT electrode by increasing the density of CNTs after formation of the net-shaped CNT thin film, one or more steps of forming a film (not shown) may be further performed using the CNT composition. Film formation can also be carried out by a conventional coating method or a convective arrangement method as described hereinabove.

EXAMPLES

The present invention will be described in more detail with reference to the following examples, which are provided only for purposes of illustration and should not be construed as limiting of the scope and spirit thereof.

Example 1

Formation of a Net-Shaped CNT Electrode Using Mixed Composition of Silica Nanoparticles and CNTs 20 mg of water soluble polythiophene (ADS12PQT, available from Amerian Dye Source) as a conductive dispersant was dissolved in 20 ml of water, and then 20 mg of single walled CNTs (available from Iljin, prepared by arc discharge method) was added to the solution. The mixture was dispersed in a sonication bath for 10 hours, and centrifuged at 10,000 rpm for 10 minutes to prepare a CNT composition.

A 1 wt % silica nanoparticle dispersion, prepared by dispersing 500 nm (average particle diameter) silica nanoparticles (available from Duke Scientific) in distilled water, was mixed with 0.05 wt % of the thus-prepared CNT composition to prepare a mixed composition. Then, two transparent PET polyester films each having a thickness of 0.17 mm were treated with $O_2$ plasma for 10 min to prepare substrates.

Figure 5A:
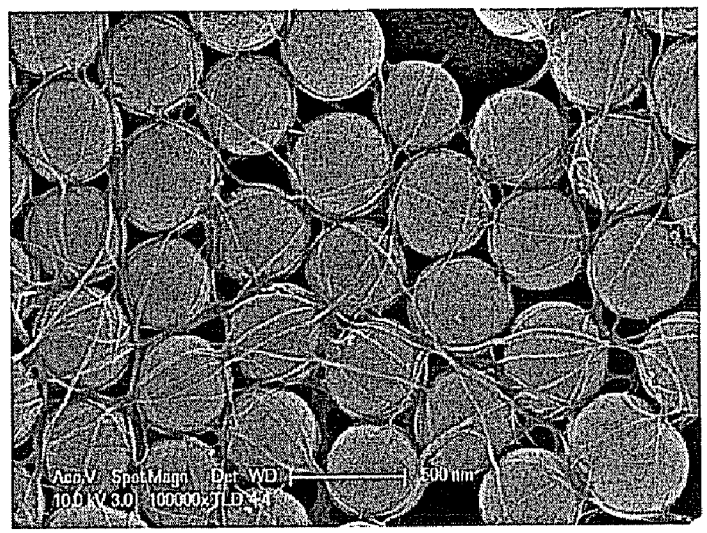
FIG. 5A is a scanning electron micrograph ("SEM") showing an exemplary thin film of a mixed CNT composition produced in Example 1.

The two substrates (transparent PET polyester films) thus treated were positioned to face opposite each other at a fixed distance of 0.1 mm, and the mixed composition at a rate of 0.8 mm/min was injected between two substrates. Thereafter, a mixed-composition thin film was formed by blowing hot air to slowly evaporate a solvent while moving one substrate horizontally (relative to the second substrate) to induce formation of a meniscus at one end of the substrate on which particles and CNTs are arranged, and to induce simultaneous movement and arrangement of particles and CNTs along the meniscus. FIG. 5a shows a plane SEM of a mixed-composition thin film formed on such a transparent substrate. As shown in FIG. 5a, CNT materials were arranged between the particulate materials to form a mixed-composition thin film.

Figure 5B:
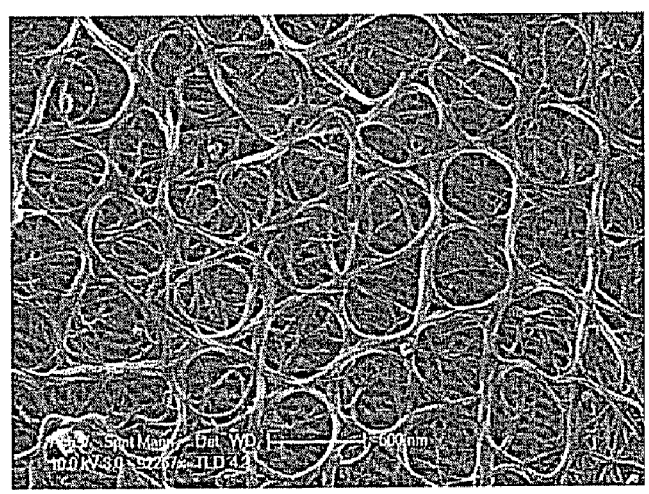
FIG. 5B is a plane SEM of an exemplary transparent CNT electrode obtained after removal of particulate materials in Example 1.

The thus obtained mixed-composition thin film on the substrate was soaked in aqueous 2.5 wt % hydrofluoric acid (HF) for 1 min to remove silica nanoparticles present on the thin film, thereby providing a transparent CNT electrode on which a net-shaped CNT thin film was formed. Light transmittance and surface resistance of the transparent CNT electrode thus prepared were measured. The results are given in Table 1 below. FIG. 5b shows an SEM of surface morphology of the transparent electrode. As shown in FIG. 5b, it was confirmed that removal of the particulate materials from the mixed-composition thin film leaves only the CNT materials, which then form the CNT thin film.

Example 2

Additional Coating of Thin Film with CNT Composition

A transparent CNT electrode was prepared in the same manner as in Example 1, except that a second coat of the CNT composition (0.25 wt % in deionized water) used in Example 1 was coated on the mixed-composition thin film using a convective arrangement method, prior to removal of silica nanoparticles of Example 1. Light transmittance and surface resistance of the transparent CNT electrode thus prepared were measured. The results are given in Table 1 below.

Comparative Example 1

Figure 6:
FIG. 6 is a plane SEM of an exemplary comparative transparent CNT electrode as obtained in Comparative Example 1.

20 mg of water soluble polythiophene (ADS12PQT, available from Amerian Dye Source) as a conductive dispersant was dissolved in 20 ml of water, and then 20 mg of single walled CNTs (available from Iljin, prepared by arc discharge method) was added to the solution. The mixture was dispersed in a sonication bath for 10 hours, and centrifuged at 10,000 rpm for 10 minutes to prepare a CNT composition. The CNT composition thus prepared was subjected to filtration to form a CNT layer which was then applied to a transparent PET polyester film having a thickness of 0.17 mm as a substrate and dried at 60° C. for 2 hours to obtain a CNT electrode. Light transmittance and surface resistance of the transparent CNT electrode thus obtained were measured. The results are given in Table 1 below. FIG. 6 shows an SEM of surface morphology of the transparent electrode as prepared in Comparative Example 1.

TABLE 1

|  | Light transmittance (% T) | Surface resistance |
|---|---|---|
| Example 1 | 95 | 1100 Ω/sq |
| Example 2 | 92 | 6100 Ω/sq |
| Comparative Example 1 | 94 | 20,000 Ω/sq |

Evaluation of Physical Properties of Transparent Electrodes (1) Measurement of Transmittance The transmittance of the transparent electrodes was measured using a UV-Visible spectrophotometer and reported as percent transmittance of incident light.

(2) Measurement of Sheet Resistance

The sheet resistance (Ω/sq.) of the transparent electrodes was determined using a standard four-point probe and method.

As can be seen from the results of Table 1, the transparent CNT electrodes of Examples 1 and 2 exhibited a significant decrease in surface resistance while having similar light transmittance, thereby resulting in superior conductivity, as compared to the transparent CNT electrode of Comparative Example 1. Therefore, it can be confirmed that when the transparent CNT electrodes are used as transparent electrodes of devices, such as image sensors, solar cells and liquid crystal displays, excellent characteristics can be provided to the devices.

Although the preferred embodiments of the present invention have been disclosed for illustrative purposes, those skilled in the art will appreciate that various modifications and variations are possible, without departing from the scope and spirit of the invention as disclosed in the appended claims. Accordingly, such modifications and variations are intended to come within the scope of the claims.

As apparent from the above description, the transparent CNT electrode can achieve a significant improvement in light transmittance and electrical conductivity, as provided by formation of a CNT thin film in the form of a net-shaped structure. Accordingly, the transparent CNT electrode is useful in a wide range of applications, for example, as an electrode of various devices. In addition, according to the method of the present invention, it is possible to easily control the thickness of the transparent CNT electrode at a nano scale.

Furthermore, the transparent electrode can be used as a flexible transparent electrode in a flexible display such as, for example, those displays and configurations currently being developed or being considered as next-generation or future generation displays.

What is claimed is:

1. A transparent carbon nanotube (CNT) electrode, comprising:
a transparent substrate; and
a CNT film having a net-shaped structure formed on a surface of the transparent substrate,
wherein the net-shaped CNT film comprises a network of interconnected CNTs surrounding spaces previously occupied by a particulate material having a particle size of 50 nanometers to 10 micrometers.

2. The electrode according to claim 1, wherein the particulate material comprises nanoparticles.

3. The electrode according to claim 2, wherein the nanoparticles are metal nanoparticles.

4. The electrode according to claim 1, wherein the transparent substrate is a transparent inorganic substrate selected from a glass substrate or a quartz substrate, or wherein the substrate is a flexible transparent substrate made of a material selected from the group consisting of polyethylene terephthalate, polyethylene naphthalate, polyethylene sulfone, polycarbonate, polystyrene, polypropylene, polyester, polyimide, polyetheretherketone, polyetherimide, acrylic resins, olefin-maleimide copolymers, and norbornene resins.

5. The electrode according to claim 1, wherein the CNTs are selected from the group consisting of single-walled carbon nanotubes, double-walled carbon nanotubes, multi-walled carbon nanotubes, rope carbon nanotubes, and a combination thereof.

6. The electrode according to claim 5, wherein the single-walled carbon nanotubes are metallic carbon nanotubes.

7. The electrode according to claim 1, wherein the net-shaped CNT film further includes a dispersant.

8. The electrode according to claim 7, wherein the dispersant is a conductive dispersant.

9. An electronic device comprising the transparent CNT electrode of claim 1.

10. The device according to claim 9, wherein the electronic device is selected from the group consisting of image sensors, solar cells, liquid crystal displays, organic electroluminescence (EL) displays, and touch screen panels.

* * * * *